(12) United States Patent
Chang et al.

(10) Patent No.: US 8,093,074 B2
(45) Date of Patent: Jan. 10, 2012

(54) ANALYSIS METHOD FOR SEMICONDUCTOR DEVICE

(75) Inventors: Chih-Chung Chang, Tainan County (TW); Jian-Chang Lin, Tainan County (TW); Wen-Sheng Wu, Tainan County (TW); Ching-Lin Chang, Kaohsiung (TW); Chih-Yang Tsai, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 241 days.

(21) Appl. No.: 12/653,864

(22) Filed: Dec. 18, 2009

(65) Prior Publication Data

US 2011/0151597 A1   Jun. 23, 2011

(51) Int. Cl.
*H01L 21/66* (2006.01)

(52) U.S. Cl. ............ 438/17; 438/14; 250/307; 324/512; 257/E21.531

(58) Field of Classification Search ................ 438/14, 438/17; 250/307; 324/512; 257/E21.531
See application file for complete search history.

(56) References Cited

U.S. PATENT DOCUMENTS

| | | | |
|---|---|---|---|
| 5,926,688 A * | 7/1999 | Lee et al. | 438/4 |
| 2005/0029661 A1* | 2/2005 | Vallet et al. | 257/758 |
| 2008/0009140 A1* | 1/2008 | Williamson et al. | 438/706 |
| 2008/0218185 A1* | 9/2008 | Furukawa et al. | 324/753 |
| 2009/0179161 A1* | 7/2009 | Ward et al. | 250/492.21 |

* cited by examiner

*Primary Examiner* — Angel Roman
(74) *Attorney, Agent, or Firm* — WPAT., P.C.; Justin King

(57) ABSTRACT

An analysis method for a semiconductor device is described. The semiconductor device having an abnormal region is provided. Thereafter, a focused ion beam microscope analysis process is performed to the abnormal region, wherein the result of the focused ion beam microscope analysis process shows that the abnormal region has a defect therein. After the focused ion beam microscope analysis process, an electrical property measurement step is performed to the abnormal region, so as to determine whether the defect in the abnormal region is a device failure root cause or not.

19 Claims, 13 Drawing Sheets

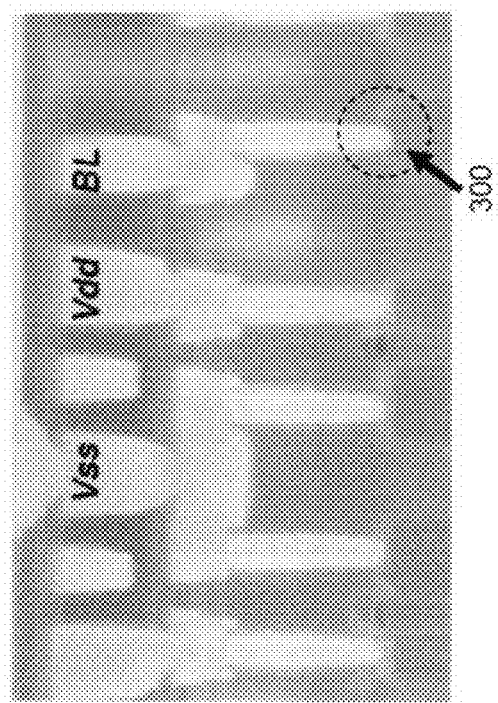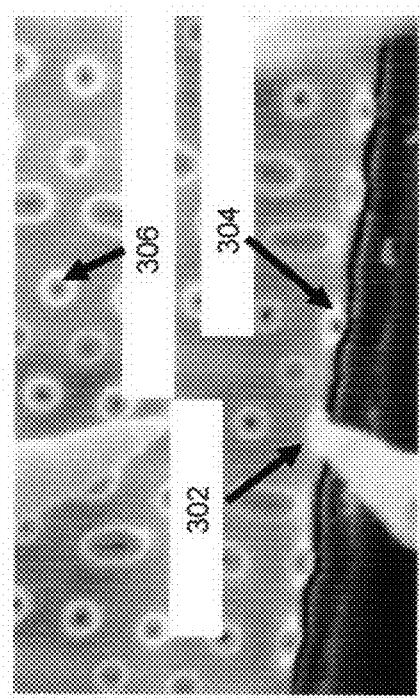
Fig.3
Fig.4

ANALYSIS METHOD FOR SEMICONDUCTOR DEVICE

BACKGROUND OF THE INVENTION

1. Field of Invention

The present invention relates to an analysis method, and more generally to an analysis method for a semiconductor device.

2. Description of Related Art

The fabrication process of a semiconductor integrated circuit (IC) chip is substantially divided into a front-end process and a back-end process. The front-end process is for fabricating an integrate circuit on a wafer. The back-end process is for packaging the wafer with the fabricated integrated circuit thereon. During the front-end and back-end processes, many structural tests and electrical property tests are performed frequently, so as to ensure the reliability and the yield of the chip. If these testing results show the wafer is abnormal, examples of the common testing apparatus include a scanning electron microscope (SEM), a transmitting electron microscope (TEM), and a focused ion beam (FIB) microscope, etc is used to fine the defects on the wafer.

Generally, TEM has been widely applied to perform the device failure analysis and the process evaluation for a semiconductor device with high density, so as to solve the problem of the yield and the device reliability. Before a TEM analysis is performed, a FIB microscope analysis process is usually conducted. The FIB microscope analysis process can provide an initial analysis result. On the other hand, the focused ion beam can thin the semiconductor device, so as to provide the transparency required for the electron beam of the subsequent transmitting electron microscope, and thus, a clear image is obtained.

However, the conventional method by using the FIB microscope and the TEM to perform the device failure analysis usually exists a problem. The conventional method cannot determine whether the observed abnormal region or the defect site is the real defect leading to the device failure.

SUMMARY OF THE INVENTION

The present invention provides an analysis method for a semiconductor device. The conventional analysis method has the difficulty in determining whether the abnormal region of the semiconductor device has the real defect leading to the device failure, and the analysis method of the present invention can solve the problem.

The present invention provides an analysis method for a semiconductor device. The semiconductor device having an abnormal region is provided. A focused ion beam (FIB) microscope analysis process is performed to the abnormal region, wherein the result of the FIB microscope analysis process shows that the abnormal region has a defect therein. After the FIB microscope analysis process, an electrical property measurement step is performed to the abnormal region, so as to determine whether the defect in the abnormal region is a device failure root cause or not.

According to an embodiment of the present invention, the analysis method further include performing an optional transmitting electron microscope (TEM) analysis process after the electrical property measurement step.

According to an embodiment of the present invention, the electrical property measurement step includes a nano-probing measurement process or a conductive atomic force microscope (C-AFM) measurement process.

According to an embodiment of the present invention, the nano-probing measurement process or the C-AFM measurement process further includes generating a current-voltage curve, so as to determine whether the defect in the abnormal region is the device failure root cause or not.

According to an embodiment of the present invention, the FIB microscope analysis process includes using a focused ion beam to cut the semiconductor device down to the abnormal region, so as to form an opening in the abnormal region.

According to an embodiment of the present invention, the step of using the focused ion beam to cut the semiconductor device down to the abnormal region includes using an ion beam to cut the semiconductor device down to the abnormal region and using an electron beam to perform a monitor process.

According to an embodiment of the present invention, the analysis method further includes forming a protection layer on the surface of the semiconductor device before the step of using the focused ion beam to cut the semiconductor device down to the abnormal region.

According to an embodiment of the present invention, the semiconductor device has a metal-oxide semiconductor device layer and an interconnection layer on the metal-oxide semiconductor device layer.

According to an embodiment of the present invention, before performing the electrical property measurement step, the analysis method further includes filling a coating layer in the opening and performing a polishing process until the interconnection layer is exposed.

According to an embodiment of the present invention, the abnormal region is located in the metal-oxide semiconductor device layer or the interconnection layer.

The present invention further provides an analysis method for a semiconductor device. The semiconductor device having an abnormal region is provided. A FIB microscope analysis process is performed to the abnormal region, wherein the result of the FIB microscope analysis process shows that the abnormal region has a first defect therein. After the FIB microscope analysis process, an electrical property measurement step is performed to the abnormal region, wherein the result of the electrical property measurement step shows that the first defect is not a device failure root cause. After the electrical property measurement step, the FIB microscope analysis process is performed again to the abnormal region, wherein the result of the FIB microscope analysis process shows that the abnormal region has a second defect, and the second defect is the device failure root cause.

According to an embodiment of the present invention, the electrical property measurement step includes a nano-probing measurement process or a C-AFM measurement process.

According to an embodiment of the present invention, the nano-probing measurement process or the C-AFM measurement process further includes generating a current-voltage curve, the current-voltage curve of the electrical property measurement step showing that the first defect is not the device failure root cause.

According to an embodiment of the present invention, the FIB microscope analysis process includes using a focused ion beam to cut the semiconductor device down to the abnormal region, so as to form an opening in the abnormal region.

According to an embodiment of the present invention, the step of using the focused ion beam to cut the semiconductor device down to the abnormal region includes using an ion beam to cut the semiconductor device down to the abnormal region and using an electron beam to perform a monitor process.

According to an embodiment of the present invention, the analysis method further includes forming a protection layer on the surface of the semiconductor device before the step of using the focused ion beam to cut the semiconductor device down to the abnormal region.

According to an embodiment of the present invention, the semiconductor device has a metal-oxide semiconductor device layer and an interconnection layer on the metal-oxide semiconductor device layer.

According to an embodiment of the present invention, before performing the electrical property measurement step, the analysis method further includes filling a coating layer in the opening and performing a polishing process until the interconnection layer is exposed.

According to an embodiment of the present invention, the abnormal region is located in the metal-oxide semiconductor device layer or the interconnection layer.

In view of the above, in the present invention, after a FIB microscope analysis process, an electrical property measurement step is performed to the abnormal region of a semiconductor device, so as to determine whether the defect in the abnormal region is a device failure root cause or not. Therefore, the method in accordance with the present invention can identify the real defect leading to the device failure in the semiconductor device more precisely than the conventional analysis method.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3 to 5 are the related figures of the analysis method according to Example 1 of the present invention.

DESCRIPTION OF EMBODIMENTS

Figure 1:
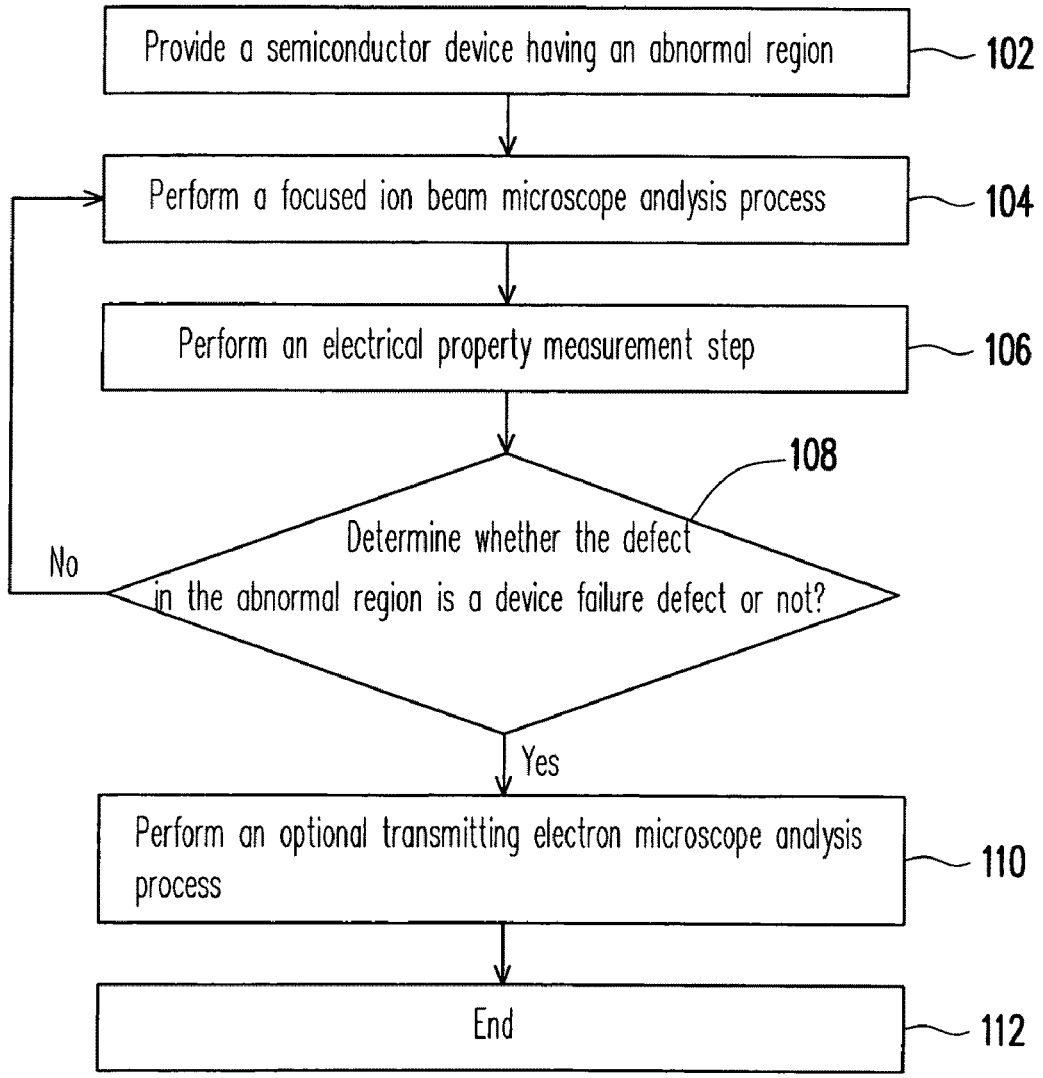
FIG. 1 schematically illustrates a process flow of an analysis method for a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 schematically illustrates a process flow of an analysis method for a semiconductor device according to an embodiment of the present invention. FIGS. 2A to 2E schematically illustrate cross-sectional views of an analysis method for a semiconductor device according to an embodiment of the present invention. In the analysis method, referring to FIG. 1, a step 102 which provides a semiconductor device having an abnormal region is implemented.

Figure 2A:
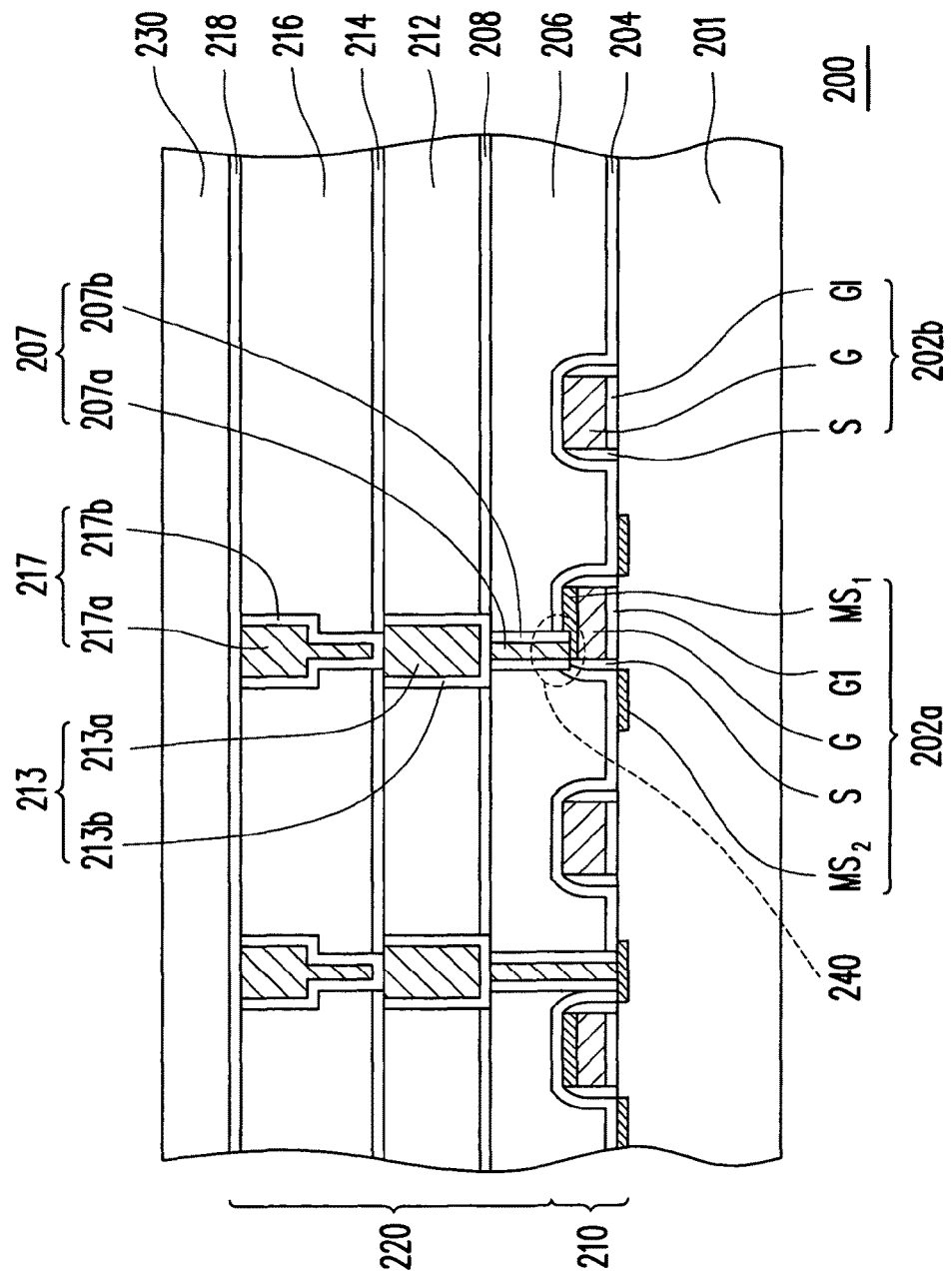
FIGS. 2A to 2E schematically illustrate cross-sectional views of an analysis method for a semiconductor device according to an embodiment of the present invention.

In the step 102, the semiconductor device is shown as FIG. 2A. The semiconductor device 200 includes a substrate 201, a metal-oxide semiconductor device layer 210 on the substrate 201, and an interconnection layer 220 on the metal-oxide semiconductor device layer 210. The substrate 201 may be a silicon substrate or a semiconductor substrate. The metal-oxide semiconductor device layer 210 includes a plurality of metal-oxide semiconductor devices 202a and 202b. The metal-oxide semiconductor device 202a includes a gate G, a gate insulation layer GI, a spacer S and metal silicide layers MS1 and MS2, etc. The metal-oxide semiconductor device 202b includes a gate G, a gate insulation layer GI and a spacer S, etc. The metal-oxide semiconductor devices 202a and 202b can be transistors, resistors, fuses or other devices. Further, the interconnection layer 220 on the metal-oxide semiconductor device layer 210 includes dielectric layers 204, 206, 208, 212, 214, 216 and 218 and interconnect structures 207, 213 and 217 therein. The interconnect structure 207 is mainly for electronically connecting the interconnect structure 213 and the metal-oxide semiconductor device 202a, and the interconnect structure 207 includes a metal conductive structure 207a and a barrier layer 207b around the metal conductive structure 207a, for example. The interconnect structure 213 is mainly for electronically connecting the interconnect structure 207 and the interconnect structure 217, and the interconnect structure 213 includes a metal conductive structure 213a and a barrier layer 213b around the metal conductive structure 213a, for example. The interconnect structure 217 is mainly for electronically connecting the interconnect structure 213 underneath and an interconnect structure (not shown) disposed above the interconnect structure 217, and the interconnect structure 217 includes a metal conductive structure 217a and a barrier layer 217b around the metal conductive structure 217a, for example. The interconnect structures 207, 213 and 217 can be contact plugs, damascene structures, dual-damascene structures or other interconnect structures. It is noted that the devices illustrated in this embodiment and the figures are only provided for illustration purposes, and thereby enable persons skilled in the art to practice the present invention, but are not intended to limit the scope of the present invention.

Generally, during the fabrication process of the semiconductor device, defects may be formed in some devices due to the deposition, lithography, etching or other processes. If the formed defects have an effect on the performance of the device, the device may not be able to operate normally. The detailed process flow of the analysis for the above-mentioned semiconductor device will be illustrated in details in the following. This embodiment in which the metal-oxide semiconductor device layer 210 of the semiconductor device 200 has an abnormal region is provided for illustration purposes, and is not construed as limiting the present invention. As shown in FIG. 2A, an abnormal region 240 is found in the metal-oxide semiconductor device layer 210 of the semiconductor device 200 by some testing processes. The testing processes include the known testing processes such as an abnormal region determination step and an abnormal region positioning step, etc.

Thereafter, a step 104 of FIG. 1 which performs a focused ion beam (FIB) microscope analysis process is implemented. The FIB microscope analysis process is described as FIGS. 2A and 2B. First, referring to FIG. 2A, a protection layer 230 is formed on the surface of the semiconductor device 200. The protection layer 230 can protect the portion of the semiconductor device 200 outside of the abnormal region 204 from being damaged by the ion beam of the FIB microscope analysis process. The protection layer 230 can be a platinum (Pt)

film or a tungsten (W) film. Afterwards, referring to FIG. 2B, the focused ion beam 250 is used to cut the semiconductor device 200 down to the abnormal region 240, so as to form an opening 252 in the corresponding abnormal region 240, and the opening 252 exposes the abnormal region 240. According to a preferred embodiment of the present invention, the focused ion beam 250 is a dual beam FIB and includes using an ion beam 250a to cut the semiconductor device 200 down to the abnormal region 240 and using an electron beam 250b to perform a monitor process.

In the FIB microscope analysis process (step 104), since the semiconductor device 200 has been cut down to the abnormal region 240, the cross-section of the abnormal region 204 can be observed via a microscope. In this embodiment, as shown in FIG. 2B, a partial missing between the interconnect structure 207 and the metal silicide layer MS1 of the metal-oxide semiconductor device 202a is found through the FIB microscope analysis process.

To further understand the result of the FIB microscope analysis process (step 104), i.e. to determine whether the partial missing between the interconnect structure and the metal silicide layer is the real defect leading to the device failure, a step 106 in FIG. 1 which performs an electrical property measurement step is implemented.

Figure 2B:
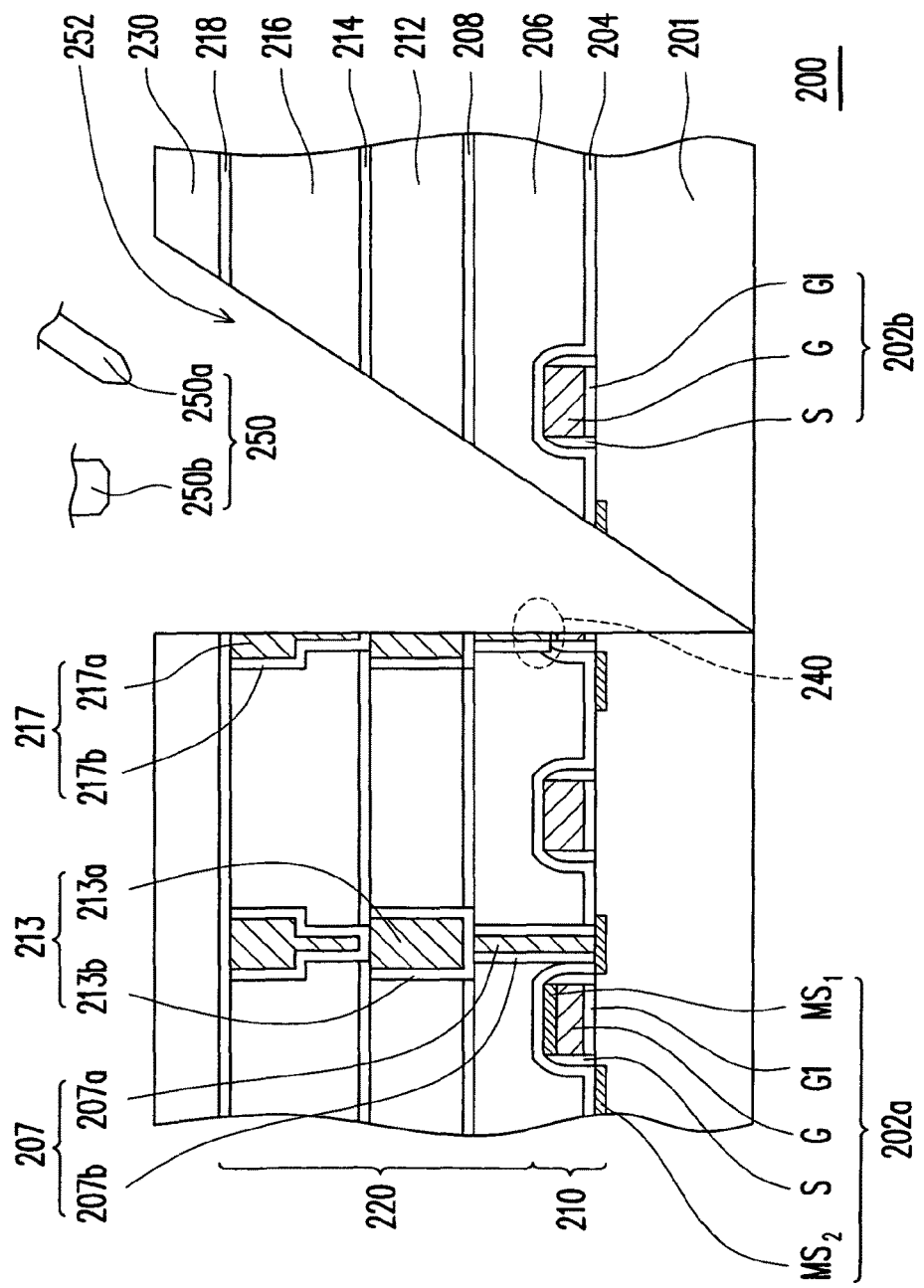
Figure 2C:
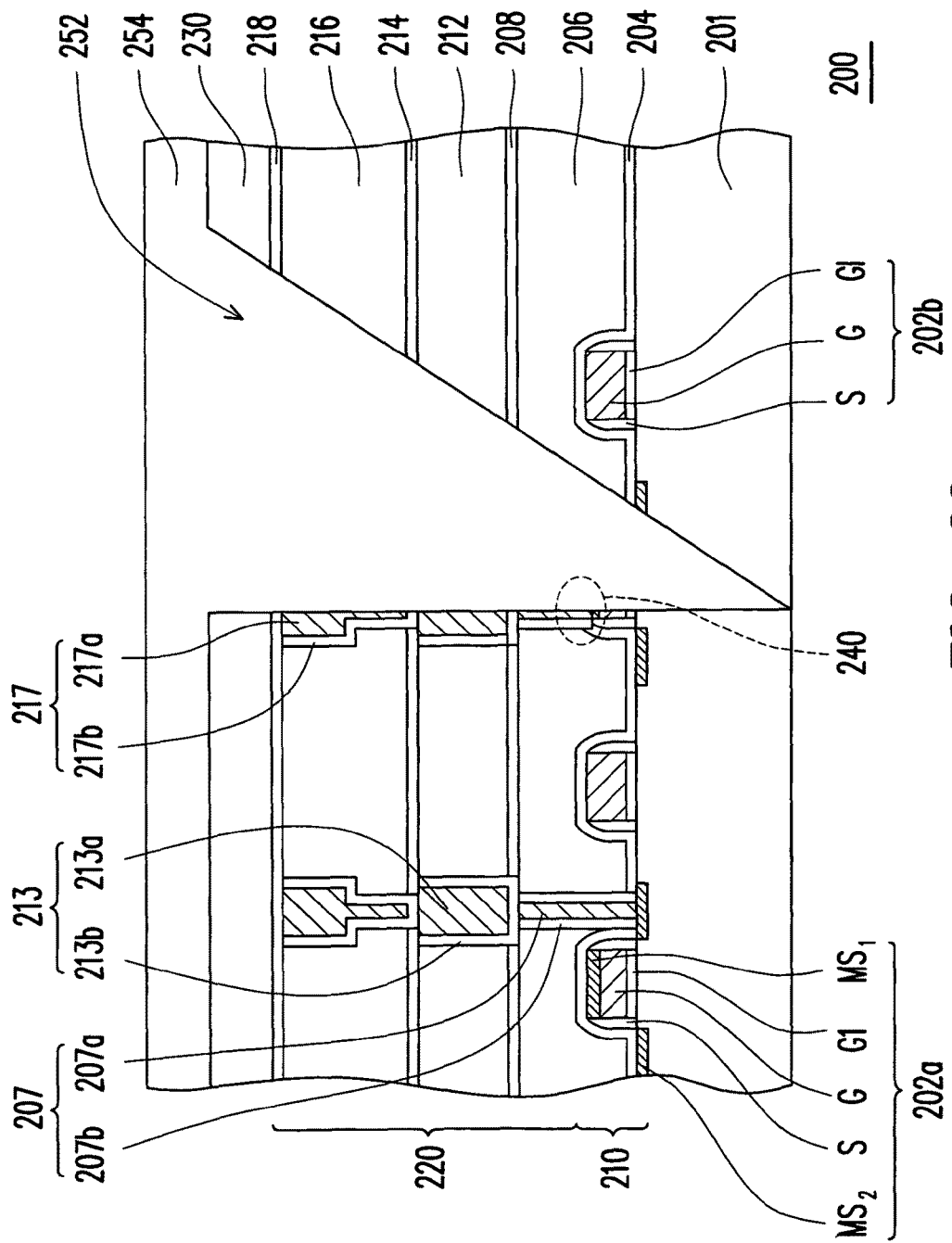

According to an embodiment of the present invention, before the step 106 which performs the electrical property measurement step is implemented, referring to FIG. 2C, a coating layer 254 is filled in the opening 252 as shown in FIG. 2B. The coating layer 254 not only fills up the opening 252, but also covers the whole semiconductor device 200 and the protection layer 230. The method of forming the coating layer 254 includes using a coating process such as a spin-coating process. The material of the coating layer 254 includes an insulation material such as an organic material or an inorganic material. The common organic material includes epoxy resin, for example.

Figure 2D:
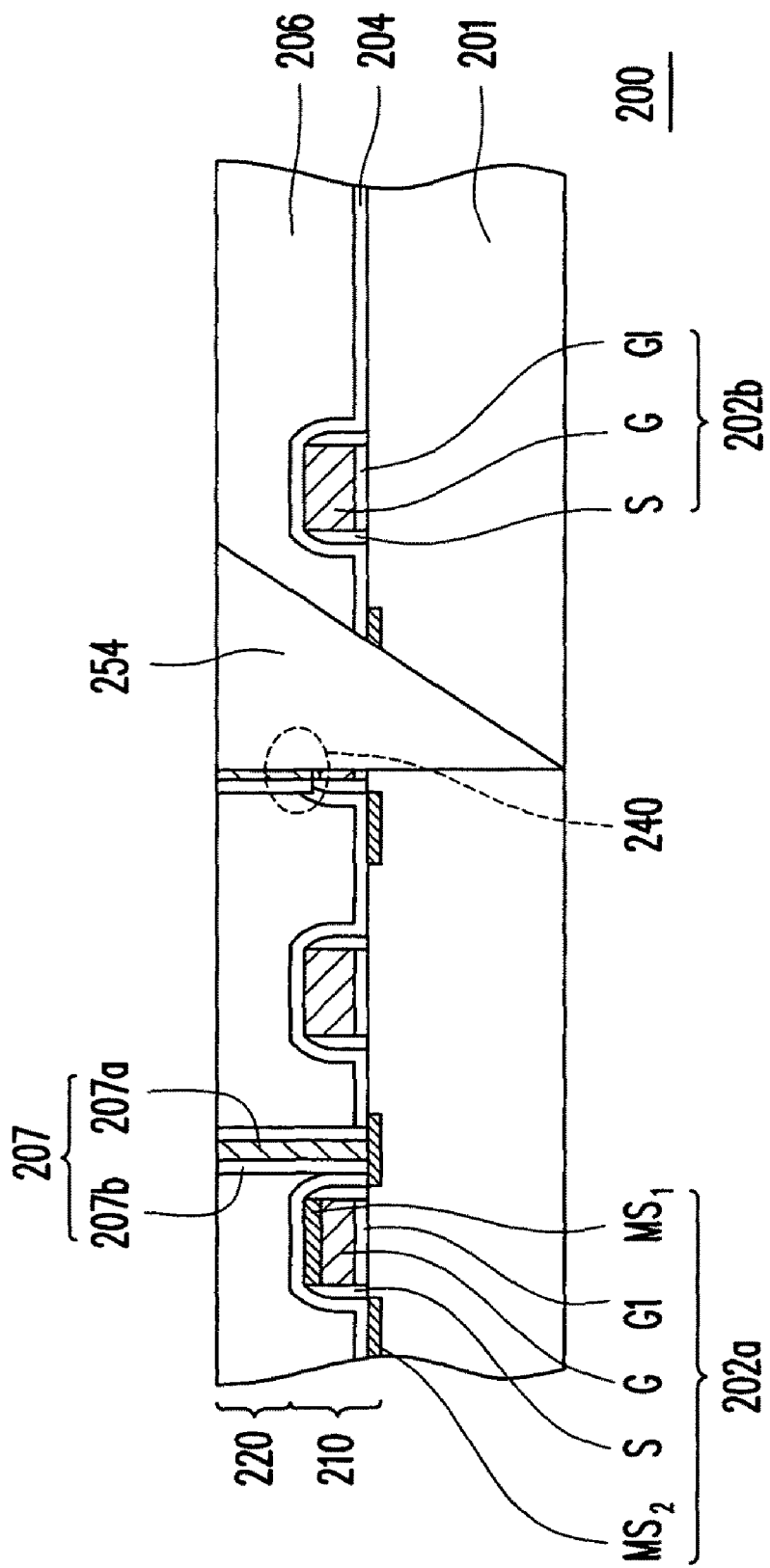

Then, referring to FIG. 2D, a polishing process is performed to the structure as shown in FIG. 2C until the interconnect layer 220 of the semiconductor device 200 is exposed. The polishing process is a chemical mechanical polishing (CMP) process, for example.

Figure 2E:
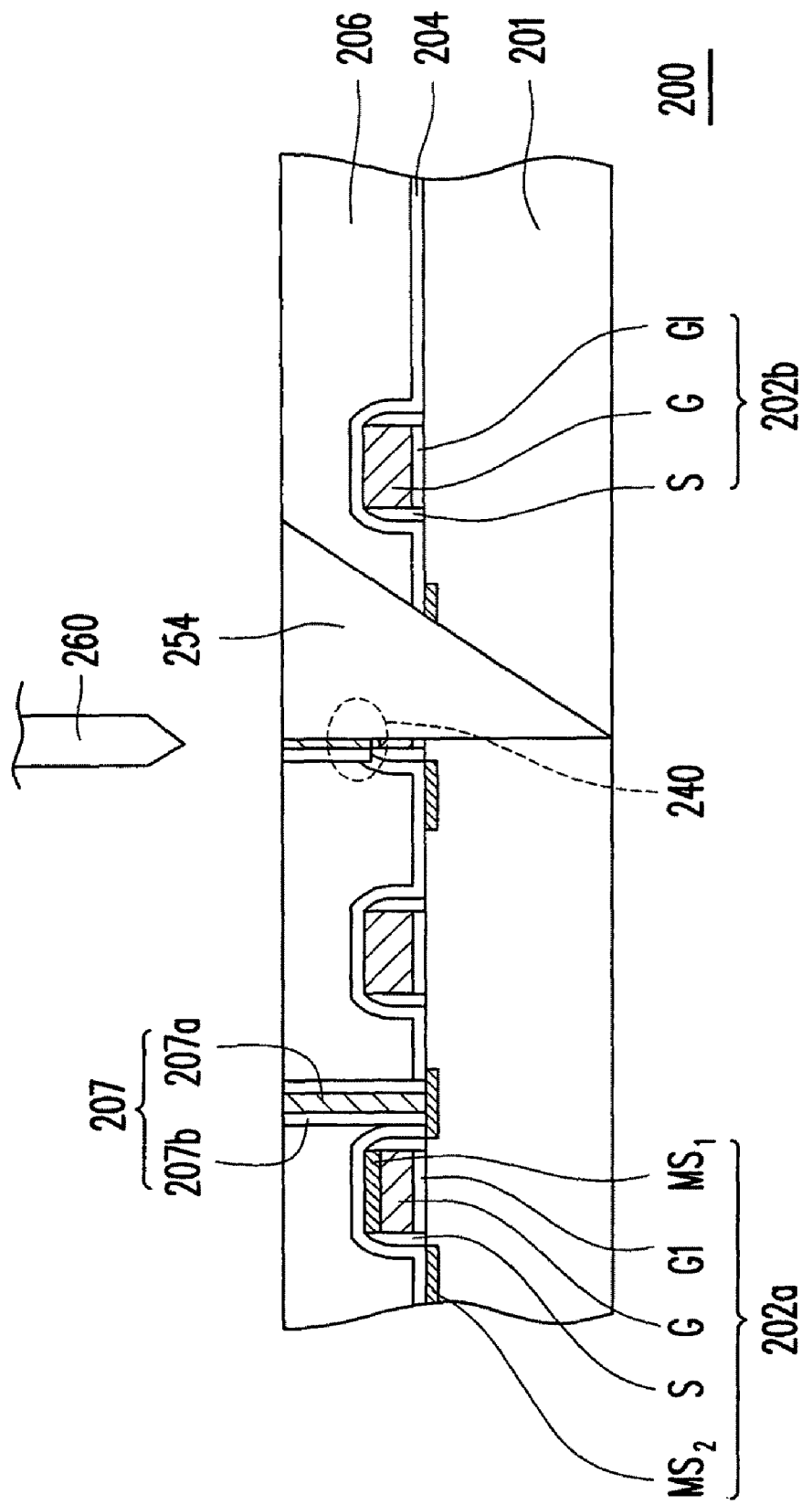

After the steps of FIGS. 2C and 2D are completed, the electrical property measurement step is performed (step 106 in FIG. 1). As shown in FIG. 2E, the electrical property measurement step includes a nano-probing measurement process or a conductive atomic force microscope (C-AFM) measurement process. In details, a nano-probe 260 or a conductive atomic force microscope 260 is adopted to perform the electrical property measurement to the abnormal region 240. In the nano-probing measurement process or the C-AFM measurement process, a current-voltage curve is also generated at the same time, so as to determine whether the defect in the abnormal region 240 is the real defect leading to the device failure.

After the electrical property measurement step is completed, a step 108 in FIG. 1 which determines whether the defect in the abnormal region 240 is the real defect leading to the device failure is implemented. If the result of the electrical property measurement step shows that the defect in the abnormal region 240 is the real defect leading to the device failure, a step 110 which performs a transmitting electron microscope (TEM) analysis process may be implemented. The defect in the abnormal region 240 can be further clearly observed through the TEM analysis process. Alternatively, if the result of the electrical property measurement step shows that the defect in the abnormal region 240 is the real defect leading to the device failure, the process flow of the analysis may be directly ended (step 112) without performing the TEM analysis process.

However, if the result of the electrical property measurement step shows that the defect in the abnormal region 240 is not a device failure root cause, returning to the step 104 which is the FIB microscope analysis process. The defects in the abnormal region 240 are analyzed again through the FIB microscope analysis process, so as to find out the real defect leading to the device failure. The process flow of the analysis is then ended (step 112).

In view of the above, the analysis method can effectively determine whether the defect in the abnormal region is the real defect leading to the device failure. Therefore, the analysis method of the present invention can identify the real defect leading to the device failure more precisely than the conventional analysis method.

It is noted that the present invention is illustrated with the embodiment as shown in FIGS. 2A to 2E in which the abnormal region is located in the metal-oxide semiconductor device layer 210. However, according to another embodiment, the analysis method can be applied to the interconnection layer 220. If the abnormal region occurs in the interconnection layer, in the step 104 of the FIB microscope analysis process, the focused ion beam can selectively cut the semiconductor device 200 down to the interconnection layer where the abnormal region is located. Further, the polishing process before the step 106 can be polished merely to the interconnection layer where the abnormal region is located. The analysis method for the abnormal region located in the interconnection layer is similar to that for the same located in the metal-oxide semiconductor device layer. Therefore, persons skilled in the art can clearly understand the practical operation of the analysis method for the abnormal region located in the interconnection layer as referred to the disclosed content in FIGS. 2A to 2E.

Three examples are numerated to illustrate the analysis method of the present invention in the following.

Example 1

The analysis method of Example 1 is conducted according to the process flow of FIG. 1. First, a semiconductor device having an abnormal region is provided (step 102).

Thereafter, a FIB microscope analysis process is performed (step 104). In the step 104, the observed microscope image is shown in FIG. 3. In the abnormal region 300 marked in FIG. 3, a partial missing between the bit line contact structure and the metal silicide layer is observed. However, if the partial missing between the bit line contact structure and the metal silicide layer is the real defect leading to the device failure has been not determined yet.

Afterwards, the process flow of FIG. 1 goes to the next step, i.e. an electrical property measurement step is performed (step 106). Before the electrical property measurement step 106, a coating process and a polishing process have been performed to the semiconductor device as shown in FIGS. 2C and 2D. In Example 1, the electrical property measurement step is adopting a nano-probing measurement process. The image as shown in FIG. 4 is observed by using the nano-probing measurement process. The region 302 in FIG. 4 corresponds to the abnormal region 300 in FIG. 3, and in the region 302, the partial missing exists between the bit line contact structure and the metal silicide layer. The region 304 is adjacent to the region 302, and in the region 304, partial missing or misalignment between the bit line contact structure and the metal silicide layer is not observed. The region 304 and the region 302 are both located in the cross-section cut by the focused ion beam. Further, in the region 306, partial missing or misalignment between the bit line contact structure and the metal silicide layer is not observed, and the region 306 is not located in the cross-section cut by the focused ion beam. In FIG. 4, it is observed that the contact area of the contact structure located in the regions 302, 304 are smaller than that of the same located in the region 306, so that the contact structure in the regions 302, 304 have a higher resistance and a lower junction current.

Figure 5:
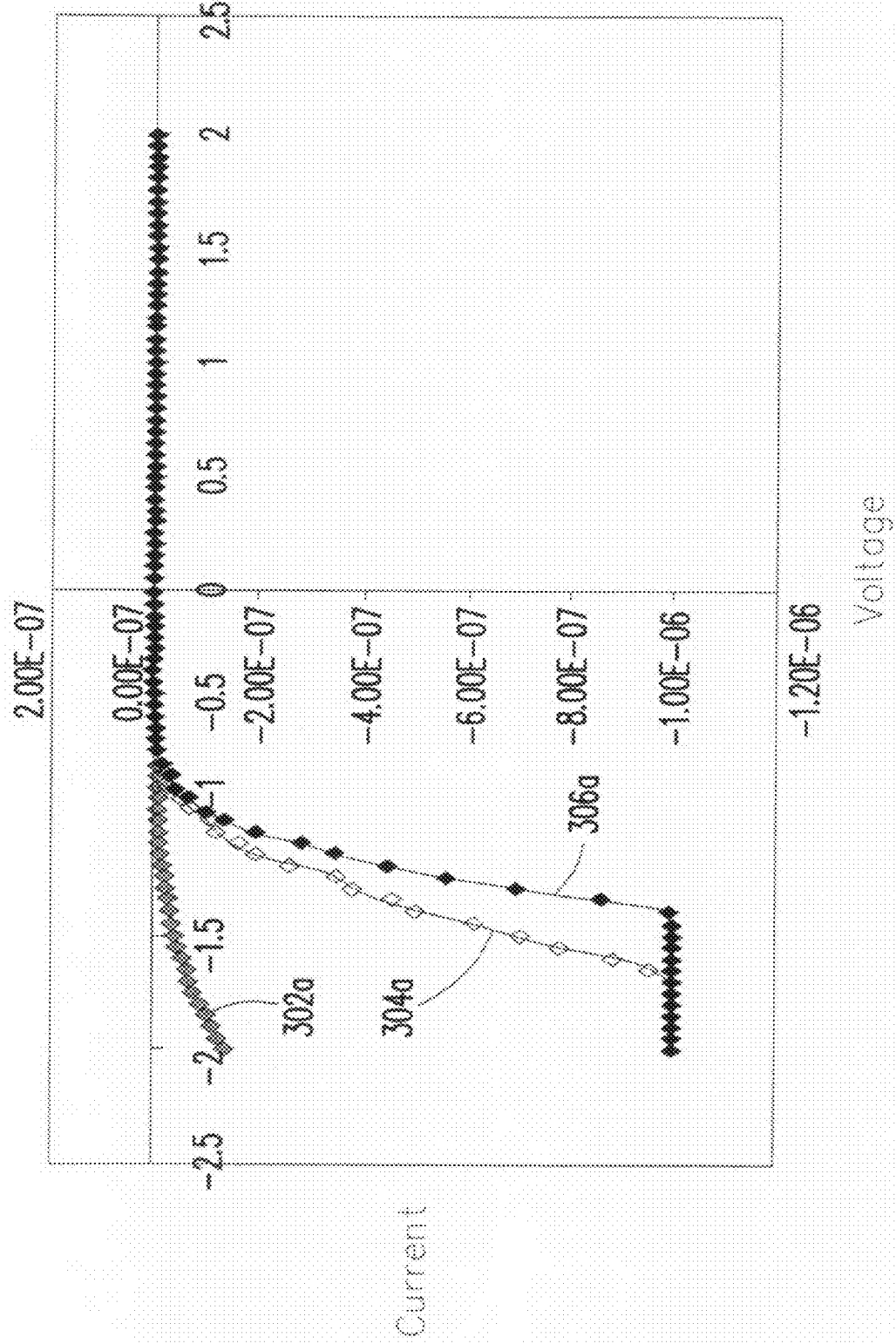

In the nano-probing measurement process, in addition to the microscope image as shown in FIG. 4, a current-voltage curve is also generated, so as to further determine whether the partial missing or misalignment between the bit line contact structure and the metal silicide layer in the region 302 is the real defect leading to the device failure. Referring to FIG. 5, X-axis represents voltage, Y-axis represents current, and curves 302a, 304a and 306a respectively represents the current-voltage curves corresponding to regions 302, 304 and 306. As shown in FIG. 5, the junction current of the curve 302a is obviously lower than that of the curve 304a, which are corresponding to the regions located in the cross-section cut by the focused ion beam. The junction current of the contact structure in the region 302 is apparently too low, so as to determine that the partial missing or misalignment between the bit line contact structure and the metal silicide layer in the region 302 is the real defect leading to the device failure. However, comparing with the curve 306a which is corresponding to no partial missing or misalignment between the bit line contact structure and the metal silicide layer, the curve 304a which is corresponding to the region located in the cross-section cut by the focused ion beam has a smaller contact area, so as to have a higher resistance and a lower junction current. The above-mentioned step is the step 108 in FIG. 1. After the step 108 in FIG. 1, the step 112 is then directly implemented to end the analysis process.

Example 2

The analysis method of Example 2 is conducted according to the process flow of FIG. 1. First, a semiconductor device having an abnormal region is provided (step 102).

Figure 6:
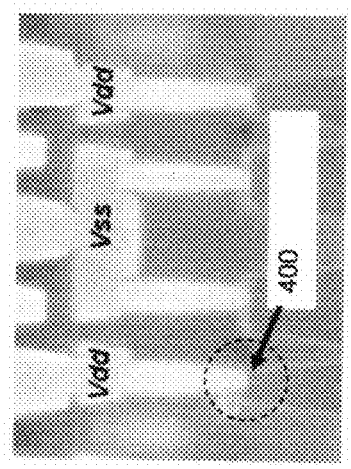
FIGS. 6 to 8 are the related figures of the analysis method according to Example 2 of the present invention.

Thereafter, a FIB microscope analysis process is performed (step 104). In the step 104, the observed microscope image is shown in FIG. 6. In the abnormal region 400 marked in FIG. 6, a loss of the metal silicide layer contacting the drain contact structure is observed. However, if the loss of the metal silicide layer contacting the drain contact structure is the real defect leading to the device failure has been not determined yet.

Figure 7:
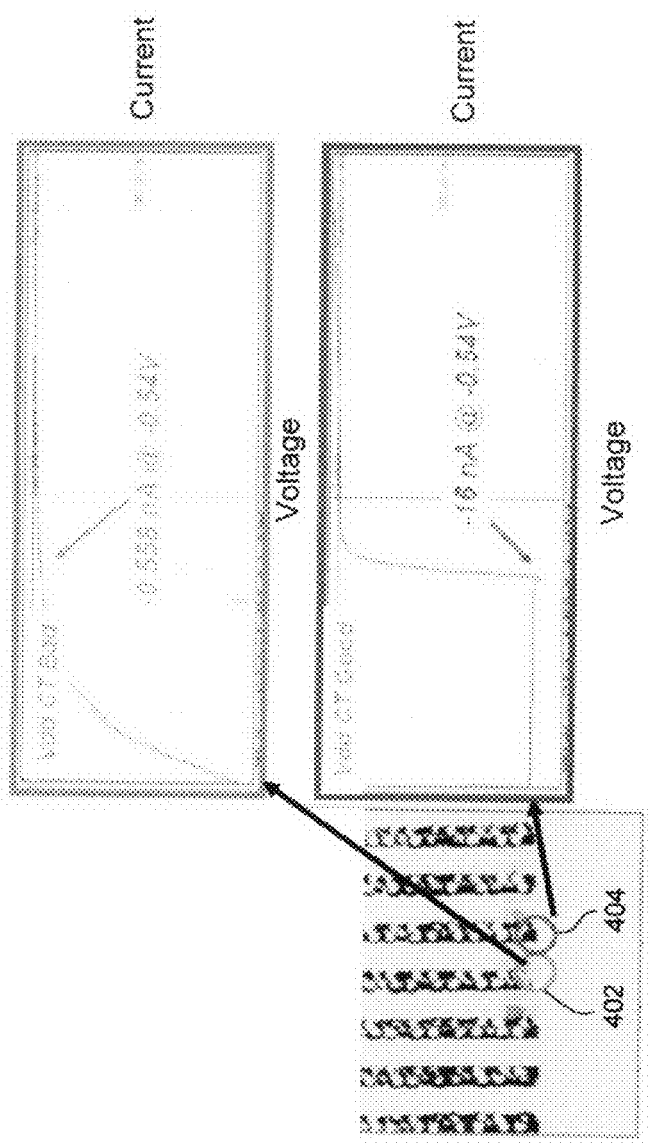

Afterwards, the process flow of FIG. 1 goes to the next step, i.e. an electrical property measurement step is performed (step 106). Before the electrical property measurement step 106, a coating process and a polishing process have been performed to the semiconductor device as shown in FIGS. 2C and 2D. In Example 2, the electrical property measurement step is adopting a conductive atomic force microscope (C-AFM) measurement process. The image as shown in FIG. 7 and a current-voltage curve can be obtained by using the C-AFM measurement process. The region 402 corresponds to the region 400 in FIG. 6, and in the region 402, the loss of the metal silicide layer contacting the drain contact structure is found. The region 404 is adjacent to the region 402, and in the region 404, a loss of the metal silicide layer contacting the drain contact structure is not observed.

In FIG. 7, it is observed that the region 402 shows a lighter color and the region 404 shows a darker color, so as to determine that the region 402 certainly has the issue of loss of the metal silicide layer. At the same time, the current-voltage curve is also generated in the C-AFM measurement process, so as to determine whether the loss of the metal silicide layer contacting the drain contact structure is the real defect leading to the device failure. Referring to FIG. 7, X-axis represents voltage and Y-axis represents current. As shown in FIG. 7, the comparison between the curve corresponding to the region 402 and the curve corresponding to the region 404 indicates that the junction current at the region 402 is apparently too low, so as to determine that the loss of the metal silicide layer contacting the drain contact structure is the real defect leading to the device failure. The above-mentioned step is the step 108 in FIG. 1.

Figure 8:
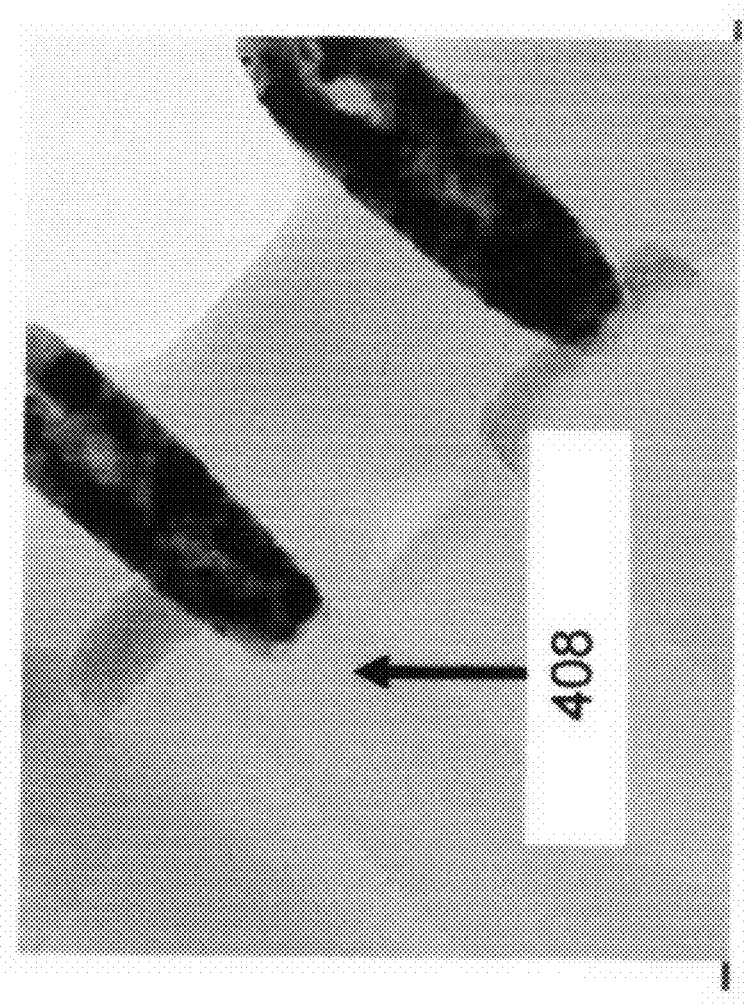

After the step 108 which determines whether the defect in the abnormal region is a device failure root cause is implemented, a step 110 in FIG. 1 which performs a TEM analysis process is further conducted. In the step 110, the observed microscope image is as shown in FIG. 8, wherein the obvious loss of the metal silicide layer is clearly observed in the region 408 (i.e. the region 402 in FIG. 7). The step 112 in FIG. 1 is then implemented to end the analysis of the process flow.

Example 3

The analysis method of Example 3 is conducted according to the process flow of FIG. 1. First, a semiconductor device having an abnormal region is provided (step 102).

Figure 9:
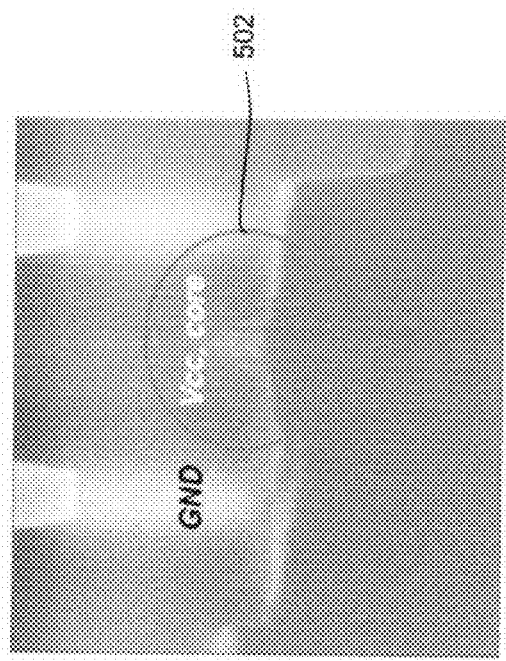
FIGS. 9 to 12 are the related figures of the analysis method according to Example 3 of the present invention.

Thereafter, a FIB microscope analysis process is performed (step 104). In the step 104, the observed microscope image is shown in FIG. 9. In the region 502 of FIG. 9, a migration of the metal silicide layer to the polysilicon layer and the substrate is observed. However, if the migration of the metal silicide layer is the real defect leading to the device failure has been not determined yet.

Figure 10:
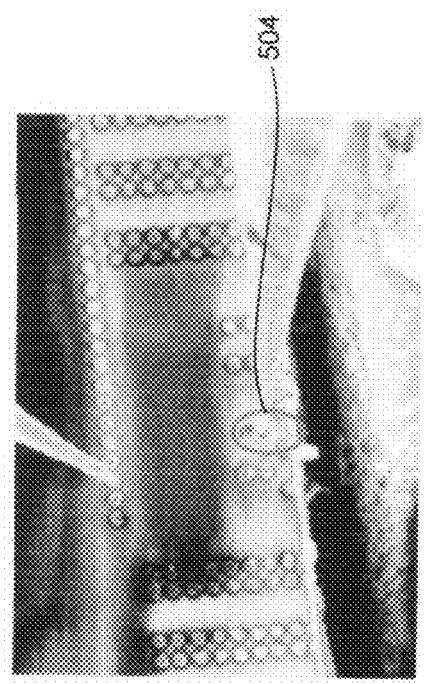

Afterwards, the process flow of FIG. 1 goes to the next step, i.e. an electrical property measurement step is performed (step 106). Before the electrical property measurement step 106, a coating process and a polishing process have been performed to the semiconductor device as shown in FIGS. 2C and 2D. In Example 3, the electrical property measurement step is adopting a nano-probing measurement process. The image as shown in FIG. 10 is observed by using the nano-probing measurement process. The region 504 corresponds to the region 502 where the polysilicon layer contacts to the contact structure, and in the region 504, the migration of the metal silicide layer is found.

Figure 11:
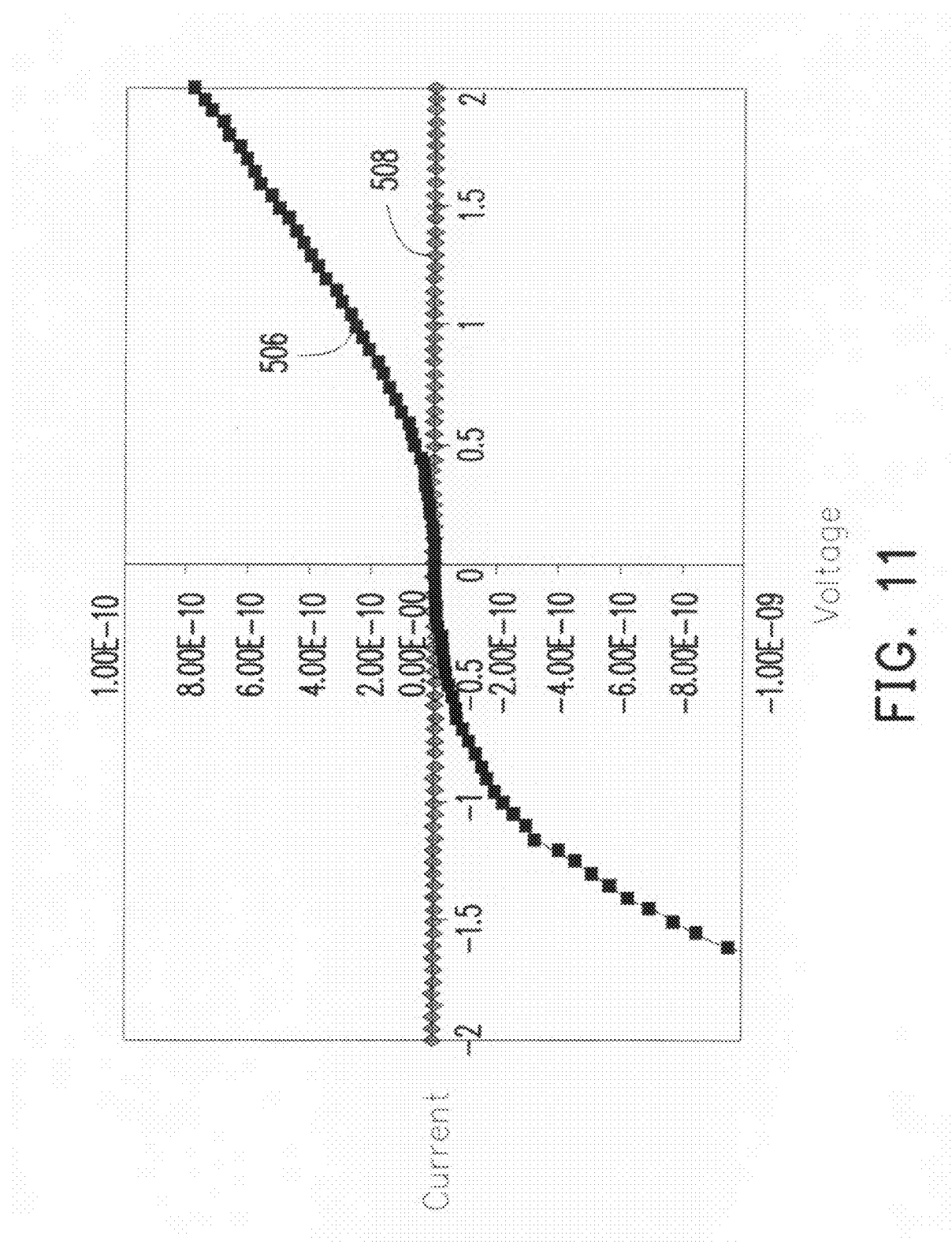

In the nano-probing measurement process, in addition to the microscope image as shown in FIG. 10, a current-voltage curve is also generated, so as to further determine whether the migration of the metal silicide layer in the region 504 is the real defect leading to the device failure. Referring to FIG. 11, X-axis represents voltage and Y-axis represents current. As shown in FIG. 11, the curve 506 is the current-voltage current corresponding to the polysilicon layer of a normal gate, and the curve 508 is the current-voltage current corresponding to the region 504 (region 502) having the migration of the metal silicide layer into the polysilicon layer of a gate. Since the semiconductor device has been cut to the abnormal region in the previous step, a leakage should generally occur if the migration of the metal silicide layer in the abnormal region is the real defect leading to the device failure. However, the curve 508 does not show any current signal.

According to the above-mentioned current-voltage curves, the distribution of the curve 508 shows that the migration of the metal silicide layer in the region 504 (region 502) is not a device failure root cause. In other words, the migration of the metal silicide layer is not the real defect leading to the device failure.

Figure 12:
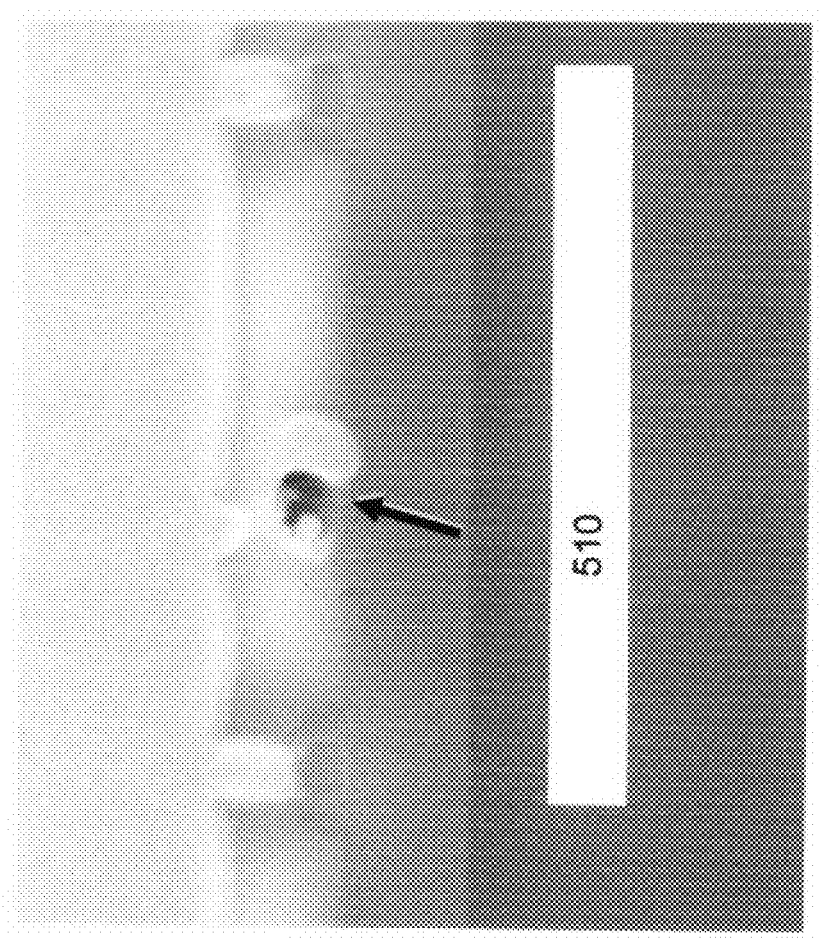

After the step 108 which determine whether the defect in the abnormal region is a device failure root cause is implemented, returning to the step 104 in FIG. 1 which is performing the FIB microscope analysis process again. After performing the step 104 again, the observed microscope image is as shown in FIG. 12. It is clearly observed that in the region 510, the defect leading to the device failure is not the migration of the silicide layer but the totally burned-out polysilicon layer of the gate. At this time, the device failure root cause in the abnormal region can be determined to be the totally burned-out polysilicon layer of the gate rather than the migration of the metal silicide layer. The step 112 in FIG. 1 is then implemented to end the analysis of the process flow.

In summary, in the analysis method of the present invention, after a FIB microscope analysis process, an electrical property measurement step is performed to the abnormal region, so as to determine whether the defect in the abnormal region is a device failure root cause. Examples 1 to 3 indicate that the analysis method of the present invention can identify the real defect leading to the device failure more precisely than the conventional analysis method.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An analysis method for a semiconductor device, comprising:
   providing the semiconductor device having an abnormal region;
   performing a focused ion beam (FIB) microscope analysis process to the abnormal region, wherein a result of the FIB analysis process shows that the abnormal region has a defect therein; and
   performing an electrical property measurement step to the abnormal region after the FIB microscope analysis process, so as to determine whether the defect in the abnormal region is a device failure root cause or not.

2. The analysis method of claim 1, further comprising performing an optional transmitting electron microscope (TEM) analysis process after the electrical property measurement step.

3. The analysis method of claim 1, wherein the electrical property measurement step comprises a nano-probing measurement process or a conductive atomic force microscope (C-AFM) measurement process.

4. The analysis method of claim 3, wherein the nano-probing measurement process or the C-AFM measurement process further comprises generating a current-voltage curve, so as to determine whether the defect in the abnormal region is the device failure root cause or not.

5. The analysis method of claim 1, wherein the FIB microscope analysis process comprises using a focused ion beam to cut the semiconductor device down to the abnormal region, so as to form an opening in the abnormal region.

6. The analysis method of claim 5, wherein the step of using the focused ion beam to cut the semiconductor device down to the abnormal region comprises using an ion beam to cut the semiconductor device down to the abnormal region and using an electron beam to perform a monitor process.

7. The analysis method of claim 5, further comprising forming a protection layer on a surface of the semiconductor device before the step of using the focused ion beam to cut the semiconductor device down to the abnormal region.

8. The analysis method of claim 5, wherein the semiconductor device has a metal-oxide semiconductor device layer and an interconnection layer on the metal-oxide semiconductor device layer.

9. The analysis method of claim 8, further, before performing the electrical property measurement step, comprising:
   filling a coating layer in the opening; and
   performing a polishing process until the interconnection layer is exposed.

10. The analysis method of claim 8, wherein the abnormal region is located in the metal-oxide semiconductor device layer or the interconnection layer.

11. An analysis method of a semiconductor device, comprising:
    providing the semiconductor device having an abnormal region;
    performing a focused ion beam (FIB) microscope analysis process to the abnormal region, wherein a result of the FIB microscope analysis process shows that the abnormal region has a first defect therein;
    performing an electrical property measurement step to the abnormal region after the FIB microscope analysis process, wherein a result of the electrical property measurement step shows that the first defect is not a device failure root cause; and
    performing the FIB microscope analysis process to the abnormal region again after the electrical property measurement step, wherein a result of the FIB microscope analysis process shows that the abnormal region has a second defect, and the second defect is the device failure root cause.

12. The analysis method of claim 11, wherein the electrical property measurement step comprises a nano-probing measurement process or a conductive atomic force microscope (C-AFM) measurement process.

13. The analysis method of claim 12, wherein the nano-probing measurement process or the C-AFM measurement process further comprises generating a current-voltage curve, the current-voltage curve of the electrical property measurement step showing that the first defect is not the device failure root cause.

14. The analysis method of claim 11, wherein the FIB microscope analysis process comprises using a focused ion beam to cut the semiconductor device down to the abnormal region, so as to form an opening in the abnormal region.

15. The analysis method of claim 14, wherein the step of using the focused ion beam to cut the semiconductor device down to the abnormal region comprises using an ion beam to cut the semiconductor device down to the abnormal region and using an electron beam to perform a monitor process.

16. The analysis method of claim 14, further comprising forming a protection layer on a surface of the semiconductor device before the step of using the focused ion beam to cut the semiconductor device down to the abnormal region.

17. The analysis method of claim 14, wherein the semiconductor device has a metal-oxide semiconductor device layer and an interconnection layer on the metal-oxide semiconductor device layer.

18. The analysis method of claim 17, further, before performing the electrical property measurement step, comprising:
    filling a coating layer in the opening; and
    performing a polishing process until the interconnection layer is exposed.

19. The analysis method of claim 17, wherein the abnormal region is located in the metal-oxide semiconductor device layer or the interconnection layer.

* * * * *